(12) United States Patent
Narahara

(10) Patent No.: US 9,758,871 B2
(45) Date of Patent: Sep. 12, 2017

(54) METHOD AND APPARATUS FOR MANUFACTURING EPITAXIAL SILICON WAFER

(75) Inventor: Kazuhiro Narahara, Nagasaki (JP)

(73) Assignee: SUMCO TECHXIV CORPORATION, Nagasaki (JP)

(*) Notice: Subject to any disclaimer, the term of this patent is extended or adjusted under 35 U.S.C. 154(b) by 1207 days.

(21) Appl. No.: 12/632,032

(22) Filed: Dec. 7, 2009

(65) Prior Publication Data

US 2010/0143579 A1   Jun. 10, 2010

(30) Foreign Application Priority Data

Dec. 10, 2008  (JP) ................................ 2008-315108
Dec. 10, 2008  (JP) ................................ 2008-315109

(51) Int. Cl.
| | | |
|---|---|---|
| *C30B 25/10* | (2006.01) | |
| *C23C 16/48* | (2006.01) | |
| *H01L 21/67* | (2006.01) | |
| *C23C 16/52* | (2006.01) | |
| *C23C 16/458* | (2006.01) | |
| *C30B 25/16* | (2006.01) | |
| *C30B 29/06* | (2006.01) | |

(52) U.S. Cl.
CPC ........ *C23C 16/481* (2013.01); *C23C 16/4583* (2013.01); *C23C 16/52* (2013.01); *C30B 25/10* (2013.01); *C30B 25/16* (2013.01); *C30B 29/06* (2013.01); *H01L 21/67248* (2013.01)

(58) Field of Classification Search
CPC ... H01L 21/67248; C23C 16/52; C30B 25/10; C30B 25/16

USPC .......................................... 117/84, 85, 86, 88
See application file for complete search history.

(56) References Cited

U.S. PATENT DOCUMENTS

| | | | | |
|---|---|---|---|---|
| 4,536,204 | A | * | 8/1985 | Van Laethem ....... C03C 17/002 65/118 |
| 5,370,709 | A | * | 12/1994 | Kobayashi .................... 29/25.01 |
| 5,998,767 | A | * | 12/1999 | Kersch et al. ................ 219/390 |

(Continued)

FOREIGN PATENT DOCUMENTS

| | | | |
|---|---|---|---|
| JP | 59057420 A | * | 4/1984 |
| JP | 8-053766 | | 2/1996 |

(Continued)

OTHER PUBLICATIONS

Japan Office action, dated Oct. 23, 2012 along with an english translation thereof.

*Primary Examiner* — Matthew Song
(74) *Attorney, Agent, or Firm* — Greenblum & Bernstein, P.L.C.

(57) ABSTRACT

A method of manufacturing an epitaxial wafer in which an epitaxial layer is grown over a main surface of a silicon wafer placed substantially horizontally on a susceptor is provided. The method comprises: a growing step of the epitaxial layer; and a cooling step of cooling the epitaxial wafer having the epitaxial layer. The cooling step comprises: a wafer measurement step of measuring a temperature of the epitaxial wafer; a susceptor measurement step of measuring a temperature of the susceptor; and a control step of controlling a heater capable of heating at least the susceptor or the epitaxial wafer such that difference between a temperature of the epitaxial wafer and a temperature of the susceptor is within a predetermined range.

10 Claims, 6 Drawing Sheets

(56) References Cited

U.S. PATENT DOCUMENTS

| | | | |
|---|---|---|---|
| 6,064,799 A * | 5/2000 | Anderson et al. | 392/416 |
| 6,207,936 B1 * | 3/2001 | de Waard et al. | 219/497 |
| 6,284,048 B1 * | 9/2001 | Van Bilsen et al. | 118/666 |
| 7,346,273 B2 | 3/2008 | Tanaka et al. | |
| 7,699,604 B2 | 4/2010 | Ito et al. | |
| 2005/0118737 A1 * | 6/2005 | Takagi et al. | 438/14 |
| 2005/0266685 A1 * | 12/2005 | Nakano et al. | 438/660 |
| 2006/0188240 A1 * | 8/2006 | Tanaka et al. | 392/416 |
| 2006/0286807 A1 * | 12/2006 | Hwang | H01L 21/67248 438/715 |
| 2008/0032036 A1 | 2/2008 | Ito et al. | |
| 2009/0205562 A1 | 8/2009 | Wada | |
| 2009/0304975 A1 | 12/2009 | Sugimoto et al. | |

FOREIGN PATENT DOCUMENTS

| | | |
|---|---|---|
| JP | 2002-016004 | 1/2002 |
| JP | 2002-164300 | 6/2002 |
| JP | 2008-060545 | 3/2008 |
| WO | 2005/010970 | 2/2005 |

* cited by examiner

METHOD AND APPARATUS FOR MANUFACTURING EPITAXIAL SILICON WAFER

CROSS REFERENCE TO RELATED APPLICATIONS

This application is based upon and claims the benefits of priorities from Japanese Patent Applications No. 2008-315108 and 2008-315109 both filed on Dec. 10, 2008, the entire contents of which are incorporated herein by reference.

FIELD OF THE INVENTION

The present invention relates to a method and an apparatus for manufacturing an epitaxial silicon wafer, which may be utilized in devices or the like of semiconductor integrated circuits. In particular, it relates to the method and the apparatus for manufacturing the epitaxial silicon wafer while a temperature of the wafer is controlled on an occasion of epitaxial growth.

BACKGROUND ART

As high-density packaging of integrated circuit devices of silicon semiconductors continues to make rapid advancements, higher quality of silicon wafers for the devices is increasingly in demand. That is, crystal defects such as dislocation causing an increase of leak current and a reduction of carrier lifetime are more and more restricted than before since circuit lines become even finer as the higher-density integration is made.

In general, in the manufacture of an epitaxial wafer, a single crystal silicon wafer forming a substrate is placed on a susceptor, the silicon wafer forming the substrate and peripheral components are cleaned, and the surface of the substrate is exposed to a silicon source such as silane or trichlorosilane at a temperature of about 800° C. or higher such that an epitaxial layer of silicon may be grown over the surface. After the epitaxial layer is grown to a predetermined thickness, the supply of a raw material gas is thereafter stopped, the silicon wafer with the epitaxial layer thereon is lowered in temperature and is removed out of a chamber, and the epitaxial wafer can be then fed to the next step. In these series of manufacturing steps, extreme caution is taken to avoid contamination and crystal defects such as dislocation.

Since the growth of the epitaxial layer is greatly affected by the temperature, the temperature control is of great importance. When a steep temperature gradient occurs between the main surface and the back surface of the silicon wafer, warpage of the silicon wafer may be caused. Even if the silicon wafer is not warped, crystal defects such as slip dislocation may be caused in the wafer. For this reason, in the case where the epitaxial layer is grown over the main surface of the silicon wafer, the drastic temperature drop is prevented by gradually supplying the raw material gas, and the output of high-frequency inductive heater to heat the susceptor is controlled such that the heat transfer from the susceptor to the silicon wafer may be regulated (for example, Japanese Unexamined Patent Application Publication No. 2002-16004).

On the other hand, a technology to prevent the slip dislocation from occurring is disclosed in which the heat treatment of the semiconductor wafer is conducted in a state that the temperature of a portion of the semiconductor wafer that comes in contact with a jig for supporting the semiconductor wafer is controlled to be 3 to 20° C. less than that of the center portion of the semiconductor wafer in a step of heat treating the semiconductor wafer at a predetermined temperature with an RTA apparatus in the semiconductor wafer manufacturing method (for example, Japanese Unexamined Patent Application Publication No. 2002-164300).

SUMMARY OF THE INVENTION

However, while the temperature control, which is effective if the flow rate of a carrier gas and/or a raw material gas and the output of high-frequency inductive heater or the like are controlled at the same time, may not apply in the same way in the case where the flow rate remains constant or heat is provided by another kind of heater (for example, a halogen lamp), and moreover, it is not easy to control the temperature adjustment since the semiconductor wafer is heated by the heat from the susceptor. On the other hand, prevention of the slip dislocation by conducting a heat treatment in a state that a temperature of at least a contact portion of the semiconductor wafer which is in contact with a support jig for supporting the semiconductor wafer is controlled to be 3 to 20° C. lower than that of the center portion of the semiconductor wafer is not necessarily effective for the dislocation generation caused by a mechanism the present inventor newly found.

In consideration of the above, the inventor of the present invention has thoroughly investigated in particular a contact portion and a vicinity thereof of a silicon wafer, the contact portion being in contact with a susceptor, in an epitaxial wafer manufacturing method of growing an epitaxial layer on a main surface of a silicon wafer serving as a substrate so as to find a cause to generate a dislocation and to conceive the present invention which can prevent effectively the dislocation generation by avoiding the cause. Thus, the present invention is to provide an epitaxial wafer manufacturing method, a manufacturing apparatus therefor, and a component thereof for manufacturing an epitaxial wafer in which dislocation generation at a contact portion of the silicon wafer in contact with a susceptor may be prevented.

In the silicon wafer manufactured by the method of manufacturing the epitaxial wafer, which has the epitaxial layer grown over the main surface of the silicon wafer being placed on the susceptor and serving as the substrate, the dislocation originated from the outer circumferential portion, in particular, the contact portion of the silicon wafer in contact with the susceptor was found. It is considered that this dislocation was caused by the stress in the vicinity of the outer circumferential portion, but it is also considered that the dislocation was caused in particular by a significant difference between the temperatures in the contact portions (and vicinities thereof) of the silicon wafer and the susceptor. This kind of temperature difference generally occurs in the outer circumferential portion (or vicinity thereof) of the silicon wafer.

In general, the temperature of the main surface of the silicon wafer serving as the substrate is monitored with a radiation thermometer or the like in the method of manufacturing the epitaxial wafer, but it is not easy to monitor the temperature of the outer circumferential portion and a vicinity thereof in consideration of the structure of the manufacturing apparatus. Hence, the temperature of the center portion of the silicon wafer has been recognized as the temperature of the epitaxial wafer. Here, the temperature control of the center portion and the outer circumferential portion is performed with great care when an epitaxial layer is grown because the temperature distribution within the wafer surface affects an epitaxial growth rate distribution. That is, in the step of the epitaxial growth, a sufficient measure is taken such that the temperature control in the center portion of the silicon wafer is enough for the epitaxial growth control.

However, even though the temperature was sufficiently controlled in the step of the epitaxial growth, defects such as dislocation were occasionally generated in the outer circumferential portion of the obtained epitaxial wafer. And, after a continuing intense investigation, it was found that such defects had been generated when the temperature difference between contact portions of the silicon wafer and the susceptor was significant during the step of cooling the epitaxial wafer after the epitaxial growth. Thus, while the temperature difference between the contact portions of the silicon wafer and the susceptor is small during the epitaxial growth, the temperature difference between them may be significant during the cooling process of the silicon wafer and the susceptor because of the cooling rate difference between the silicon wafer and the susceptor such that the significant temperature difference between respective contact portions (and vicinities thereof) may be caused.

Since the center portions of the silicon wafer and the susceptor are in particular monitored at any time, some measure may be taken so as to prevent the significant temperature difference between the center portions of the silicon wafer and the susceptor, but a relatively large temperature difference between the center portion and the outer circumferential portion of the silicon wafer can be caused during the cooling process. To the contrary, the temperature difference between the center portion and the outer circumferential portion of the susceptor is relatively small. Thus, if only the center portion of the silicon wafer is monitored, a significant temperature difference between the respective contact portions (and vicinities thereof) cannot be detected.

In consideration of the above, the temperature of the outer circumferential portion of the silicon wafer is monitored during the cooling process after the epitaxial growth and the temperature control during the cooling process is performed so as to keep the temperature difference equal to or less than a predetermined value, the difference being taken between the temperature of the outer circumferential portion and the temperature (more preferably of the outer circumferential portion although the temperature difference between the center and the outer circumferential portions is supposed to be small) of the susceptor to be monitored simultaneously with the temperature of the outer circumferential portion.

More specifically, since it is difficult to take heat away from a distant space, the output of an external heater for providing heat such as a halogen lamp is controlled as appropriate. Here, it is possible to consider that, in the cooling process, the relationship between the temperature of the center portion of the silicon wafer and the temperature of the outer circumferential portion remains constant as long as dissipation and heating environments are the same, and thus the relationship is previously determined; with an estimation method of obtaining the temperature of the outer circumferential portion from the temperature of the center portion, which is relatively easy to measure, it is possible to calculate the temperature of the outer circumferential portion from the temperature of the center portion of the silicon wafer.

The temperature of the outer circumferential portion can be obtained by calculation with the temperature of the center portion of the silicon wafer utilizing a relational formula of both temperatures as the relational formula is determined in advance. In this way, it is possible to monitor the temperature of the outer circumferential portion by monitoring only the temperature of the center portion of the silicon wafer, which is relatively easy to measure, with the result that it is possible to appropriately control the output of the external heater.

More specifically, the following method may be provided.

(1) A method of manufacturing an epitaxial wafer in which an epitaxial layer is grown over a main surface of a silicon wafer placed substantially horizontally on a susceptor may be provided. The method comprises: a growing step of the epitaxial layer; and a cooling step of cooling the epitaxial wafer having the epitaxial layer. The cooling step comprises: a wafer measurement step of measuring temperature of a contact portion of the epitaxial wafer; a susceptor measurement step of measuring temperature of the susceptor; and a control step of controlling a heater capable of heating at least the susceptor or the epitaxial wafer such that difference between temperature of the contact portion of the epitaxial wafer and temperature of the susceptor is controlled within a predetermined range.

Here, the outer circumferential portion of the epitaxial wafer can refer to a circumferential edge portion that extends to 10% of the diameter of the circular plate wafer from the outer circumference. More strictly, it can refer to a circumferential edge portion that extends to 5% of the diameter. In the temperature measurement, any desirable measurement means such as a thermocouple and a radiation thermometer (pyrometer) can be used.

(2) A method of manufacturing an epitaxial wafer in which an epitaxial layer is grown over a main surface of a silicon wafer placed substantially horizontally on a susceptor may be provided. The method comprises: a preliminary step of determining a prediction method of obtaining temperature of an outer circumferential portion of the silicon wafer from a temperature of a center portion of the epitaxial wafer substrate; and a growing step of growing actually an epitaxial layer over the main surface of the silicon wafer substrate.

The growing step comprises a growing step of the epitaxial layer and a cooling step of cooling the epitaxial wafer. The cooling step comprises a wafer measurement step of measuring temperature of the center portion of the epitaxial wafer, a susceptor measurement step of measuring temperature of the susceptor, and a control step of controlling a heater capable of heating at least the susceptor or the epitaxial wafer such that difference between the temperature of the outer circumferential portion of the epitaxial wafer which is obtained by the prediction method with the temperature of the center portion having been measured and the temperature of the susceptor may be kept within a predetermined range.

Here, the center portion of the silicon wafer substrate can refer to a portion that extends to 10% of the diameter from a circular center of the silicon wafer substrate including the epitaxial layer when linearly measured. More strictly, it can refer to a portion that extends to 5% of the diameter. The prediction (estimation) method of obtaining the temperature of the outer circumferential portion from the temperature of the center portion of the silicon wafer substrate may refer to a method of determining, through calculation or the like, the temperature of the outer circumferential portion from the temperature of the center portion under a predetermined condition.

Here, since the silicon wafer substrate rotates with the rotational center coinciding with the center of the silicon wafer substrate, it is possible to assume that the temperature of the outer circumferential portion is uniform. Hence, if the temperature in the thickness direction of the silicon wafer substrate can be assumed to be uniform, the temperature distribution from the center portion toward the outer circumferential portion can be considered as a function [the temperature of the outer circumferential portion=F (L, the temperature of the center portion) where L represents a distance from 0 to the radius of the silicon wafer substrate] with respect to a distance L from the center.

That is, the heat balance of the silicon wafer substrate is expected to be expressed by a relatively simple calculation formula irrespective of the entering and exiting of heat resulting from emission from the silicon wafer surface and a heater element, the cooling effect by the convection of a carrier gas flowing on the silicon wafer surface and a complicated thermal channel of heat or the like transferred from the susceptor and the like. For example, it may be possible to calculate the temperature with a cubic function with respect to L. Here, in a preliminary experiment, the temperatures of four or more (more preferably, five or more) locations are previously measured, and the constants of the cubic function are preferably determined by the least squares method.

(3) The method of manufacturing the epitaxial wafer according to above (1) or (2), wherein the cooling step is conducted with a cooling speed higher than a predetermined value immediately after the growing step, may be provided.

(4) The method of manufacturing the epitaxial wafer according to any one of above (1) to (3), wherein the epitaxial wafer is cooled from at 900° C. or higher, may be provided.

In the above description, the temperature is specified to be "900° C. or higher" because, in the silicon wafer including the epitaxial wafer, crystal defects such as dislocation can be considered to occur at a temperature of "900° C. or higher." Thus, in the case where crystal defects such as dislocation can be considered to occur at a lower temperature, the temperature control is preferably performed by the cooling starting at such a temperature or more. Since mobility is higher at a higher temperature and thus, crystal defects such as dislocation are more likely to occur, this control is more effective if the cooling starts at a higher temperature. However, since, at the temperature where silicon melts, it is unnecessary to examine the occurrence of these crystal defects such as dislocation, it is important to start the cooling at the melting point or less.

(5) The method of manufacturing the epitaxial wafer according to any one from above (1) to (4), wherein the heater is arranged above the epitaxial wafer and/or below the susceptor, may be provided.

(6) The method of manufacturing the epitaxial wafer according to above (5), wherein output of the heater arranged above the epitaxial wafer or below the susceptor is substantially turned off, may be provided.

(7) A susceptor that is used in an epitaxial wafer manufacturing apparatus in which an epitaxial layer is grown over the main surface of a silicon wafer substrate arranged substantially horizontally may be provided. In this susceptor, the epitaxial wafer is placed thereon, and the susceptor has the heat capacity such that, when the epitaxial wafer and the susceptor at such a high temperature that dislocation can be generated are subjected to heat-dissipation cooling, the difference in temperature between a contact portion of the outer circumferential portion of the epitaxial wafer and a supporting portion of the susceptor that comes in contact with the contact portion to support the epitaxial wafer is kept equal to or less than 30° C. for at least a predetermined period of time.

Here, the above predetermined period of time may refer to a period of time that has elapsed since the start of the heat-dissipation cooling until the entire temperature is lowered such that no dislocation is substantially generated due to the difference in temperature between the contact portion and the supporting portion. When the difference in temperature between the contact portion and the supporting portion exceeds a predetermined range, dislocation is generated in a significant period of time (for example, one second, ten seconds or the like). On the other hand, when it falls within the predetermined range, no dislocation is generated within a realistic period of time (for example, ten minutes, one hour or the like).

As this kind of predetermined temperature range, 30° C. is taken as an example. This temperature difference may be determined by various environmental factors and factors of a material itself such as impurities and defect concentration. In general manufacturing of an epitaxial silicon wafer or heat treatment using the same apparatus, the temperature difference is equal to or less than 30° C.; under conditions that are more likely to cause dislocation, the temperature difference is equal to or less than 20° C.; and, in order for dislocation to be entirely prevented, the temperature difference is preferably equal to or less than 5° C.

The above predetermined period of time depends on the apparatus, the conditions of the heat-dissipation cooling, the wafer shape and the material, and is realistically equal to or more than about 3 seconds. In consideration of safety, the predetermined period of time is more preferably equal to or more than 15 seconds, and is further preferably equal to or more than 30 seconds.

(8) A susceptor that is used in an epitaxial wafer manufacturing apparatus in which an epitaxial layer is grown over the main surface of a silicon wafer substrate arranged substantially horizontally may be provided. In this susceptor, the epitaxial wafer is placed thereon, and the difference in the heat capacity between the epitaxial wafer and the susceptor is three times or less.

When the difference in the heat capacity is small, the temperature increases in accordance with a heat quantity stored, with the result that only a slight temperature difference therebetween is generated; even if the temperature difference is generated, it is small. In particular, the difference in the heat capacity that results in the temperature difference being equal to or less than 30° C. is preferable; in order for dislocation to be highly reduced, the difference in the heat capacity that results in the temperature difference being equal to or less than 20° C. is preferable; and, in order for dislocation to be fully prevented, the difference in the heat capacity that results in the temperature difference being equal to or less than 5° C. is preferable. The difference in the heat capacity is preferably three times or less (the heat capacity of one member is three times or less than that of the other member), is more preferably two and a half times or less and is further preferably about one time (substantially the same heat capacity).

(9) An epitaxial wafer manufacturing apparatus in which an epitaxial layer is grown over the main surface of a silicon wafer substrate arranged substantially horizontally may be provided. In the epitaxial wafer manufacturing apparatus, the epitaxial wafer is made contact with and is placed on a susceptor on its outer circumferential portion, and it is possible to control a cooling process based on the heat capacities of, the absorbed amount of heat of, and the discharged amount of heat of the epitaxial wafer and the susceptor such that the difference in temperature between a contact portion of the outer circumferential portion of the epitaxial wafer and a supporting portion of the susceptor which comes in contact with the contact portion to support the epitaxial wafer is kept equal to or less than 30° C. for at least a predetermined period.

(10) The epitaxial wafer manufacturing apparatus according to above (9), wherein the epitaxial wafer is controlled to be cooled from 900° C. or more, may be provided.

(11) The epitaxial wafer manufacturing apparatus according to above (9) or (10), wherein radiation heaters are further provided above the epitaxial wafer and below the susceptor and in which at least one of the outputs of the heaters above the epitaxial wafer and below the susceptor is controlled, may be provided.

The radiation heater having a large exposure area can apply a large heat quantity to a body to be heated.

Thus, in a configuration in which the epitaxial wafer is placed on the susceptor, the heater placed above mainly heats the epitaxial wafer and the heater placed below mainly heats the susceptor. The controlling of the outputs of these heaters can mainly mean the controlling of the heat output to these members.

According to the present invention, it is possible to effectively prevent dislocation that occurs in a cooling step, and thus it is possible to manufacture a satisfactory epitaxial wafer having few defects.

Further features of the present invention, its nature, and various advantages will be more apparent from the accompanying drawings and the following description of the preferred embodiment.

DETAILED DESCRIPTION OF PREFERRED EMBODIMENT

Next, an embodiment of the present invention is now described with reference to the accompanying drawings. Components of like configuration or like function and corresponding portions thereof are referred to by common symbols throughout the drawings and their description may be omitted. And the following description also shows merely examples of embodiments according to the present invention such that modifications can be made appropriately based on the common general technical knowledge of the one skilled in the art without departing from the scope of the present invention. Therefore, the scope of the present invention is not limited to these specific examples. Further, the drawings are presented in an exaggerated way for the explanation such that components are not necessarily drawn true to the scale of the real one.

Figure 1:
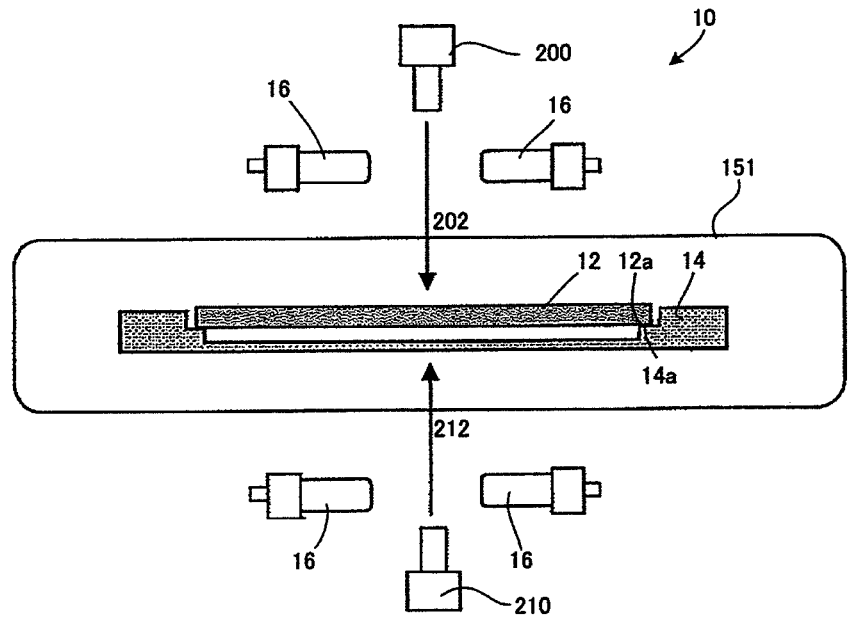
FIG. 1 is a schematic diagram of an epitaxial wafer manufacturing apparatus.

FIG. 1 is a schematic diagram of an epitaxial wafer manufacturing apparatus 10, which relates to an embodiment of the present invention. A silicon wafer serving as a substrate which is arranged in a substantially horizontal manner is placed on a susceptor 14 as a contact portion 12a of an outer circumferential portion of the silicon wafer 12 contacts a contact portion 14a of the susceptor 14 serving as a wafer supporting member. The supporting portion 14a is designed to be arranged on a step formed on the bottom surface around the inner circumference of the recess portion formed in the middle of the susceptor 14 so as to contact a small contact point (or line or area) of the silicon wafer such that the effects from the susceptor 14 may be minimized. A narrow space is provided between the back surface of the silicon wafer 12 and the bottom surface of the recess portion in the middle of the susceptor 14 such that a purge gas flows through a gap between these components so as to fill in the narrow space.

The core part including the silicon wafer 12 and the susceptor 14 of the epitaxial wafer manufacturing apparatus 10 is enclosed by a chamber 151 having an upper face and a lower face being made of transparent quartz glass, and is hermetically isolated from the outside. Although, in this figure, two halogen lamps 16 are shown both above the upper face of and below the lower face of the chamber 151 made of the quartz glass, a plurality of halogen lamps 16 (for example, 32 lamps) are arranged above the upper face rotationally symmetrically with respect to a center axis passing through the center of the silicon wafer 12.

Likewise, a plurality of halogen lamps 16 (for example, 32 lamps) are arranged below the lower face rotationally symmetrically with respect to the same center axis. Here, although not shown in the figure, reflectors are provided behind the halogen lamps 16 (on the far side from the chamber 151) such that heat emitted from the halogen lamps is effectively and evenly provided to the subject (for example, in a manner that the center portion and the outer circumferential portion of the silicon wafer 12 receive substantially the same amount of heat).

In this figure, radiation pyrometers (or radiation thermometers) 200 and 201 are provided above the upper face of and below the lower face of the chamber 151, respectively, and they are arranged at positions corresponding to the center portion of the silicon wafer 12 such that the temperatures of the center portions indicated by arrows 202 and 212 are measured.

Figure 2:
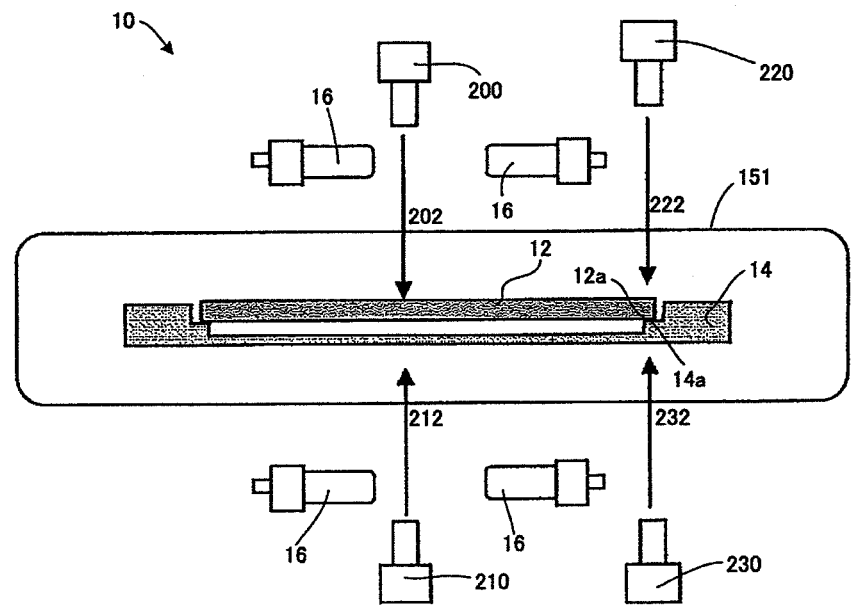
FIG. 2 is a schematic diagram of an epitaxial wafer manufacturing apparatus in which temperature monitoring is added to an outer circumferential portion.

FIG. 2 is a schematic diagram showing an epitaxial wafer manufacturing apparatus 10 similar to that shown in FIG. 1, which relates to another embodiment of the present invention. What differs from the apparatus 10 shown in FIG. 1 is that radiation pyrometers 220 and 230 are provided above the upper face and below the lower face of the chamber 151 and that they are arranged at positions corresponding to the outer circumferential portion of the silicon wafer 12 such that the temperatures of the outer circumferential portions indicated by arrows 222 and 232 are measured.

With the epitaxial wafer manufacturing apparatuses shown in FIGS. 1 and 2, the main surface of the single crystal silicon wafer serving as the substrate is exposed to a silicon source such as silane or trichlorosilane at a temperature of about 800° C. or higher, and an epitaxial layer made of silicon is grown thereon. Here, the conditions of the epitaxial growth include hydrogen used as a carrier gas and trichlorosilane used as a raw material gas.

Figure 3:
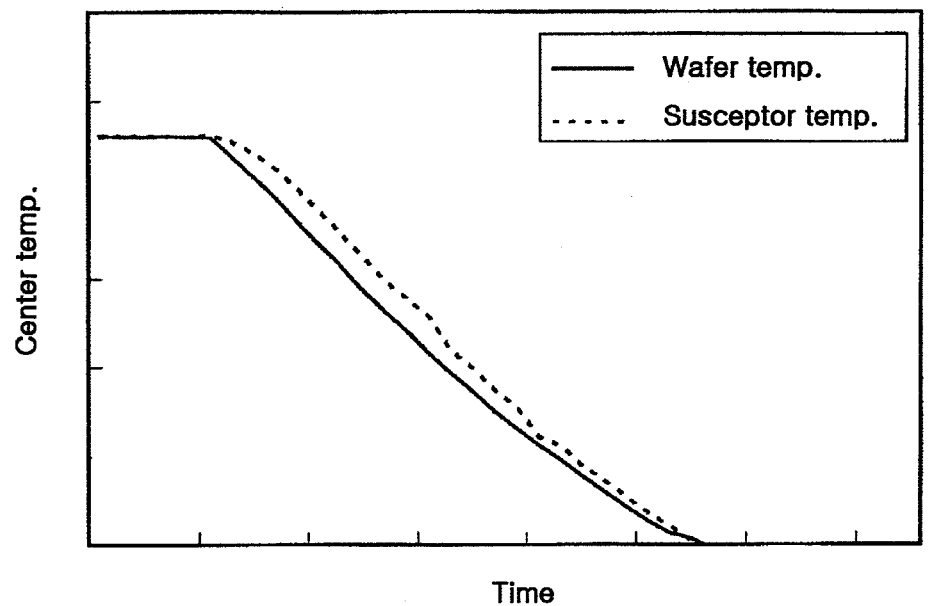
FIG. 3 is a graph showing chronological temperature changes of a center portion of an epitaxial wafer and a portion at a corresponding position of the susceptor.

FIG. 3 is a graph showing, as a function of time, the temperature of the center portion of the epitaxial wafer and the temperature of the susceptor 14 at the corresponding position when the epitaxial wafer was substantially heat-dissipation cooled (the output of the halogen lamps was minimized and an output ratio of the lamps on the upper face side to the lower face side was about 4 to 6) after growing the epitaxial layer with the manufacturing apparatus as shown in FIG. 2. From this figure, it should be understood that the temperature of the epitaxial wafer 12 was slightly lower than that of the susceptor 14.

Figure 4:
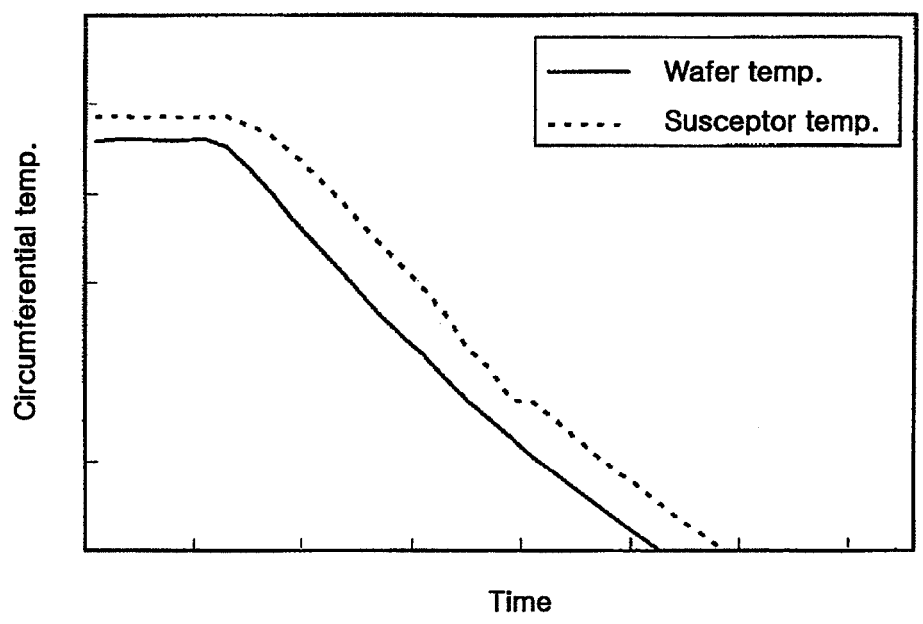
FIG. 4 is a graph showing chronological temperature changes of an outer circumferential portion of an epitaxial wafer and a portion at a corresponding position of the susceptor.

FIG. 4 shows, as a function of time, the temperature changes of the outer circumferential portion measured with the radiation pyrometers 220 and 230 in the manufacturing apparatus as shown in FIG. 2 while the temperature measurement as shown in FIG. 3 was performed. From FIG. 4, it should be understood that the temperature of the epitaxial wafer 12 was somewhat lower than that of the susceptor 14 and that the temperature difference was further widened at the cooling step.

As described above, the temperature of the outer circumferential portion was lower than that of the center portion of the epitaxial wafer, and thus it should be understood that, in order to evaluate the temperature difference of the outer circumferential portion in which the dislocation might have been generated in the cooling step, it would be preferable either to directly measure the temperature of the outer circumferential portion or to determine the temperature by a relationship (a relational formula) between them or the like having been obtained by a preliminary experiment or the like.

Figure 5:
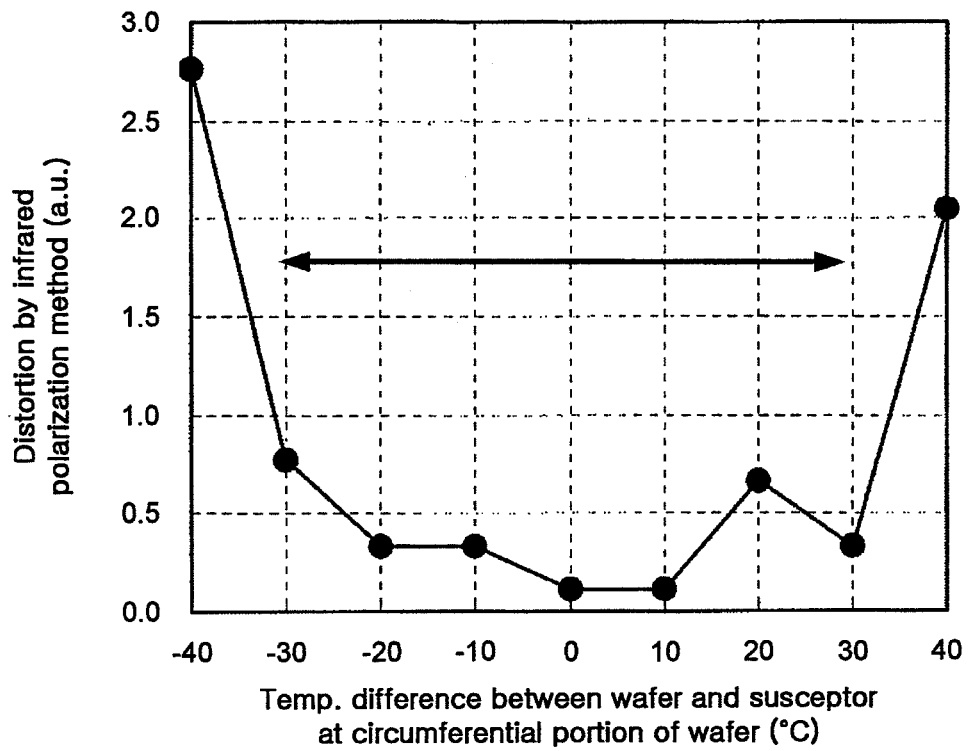
FIG. 5 is a graph showing a relation between strain and temperature difference of an outer circumferential portion of an epitaxial wafer and a portion at a corresponding position of a susceptor.

FIG. 5 is a graph showing a relationship between strain (distortion) and a temperature difference at the outer circumferential portion, which was directly measured in accordance with various conditions of the substantially heat-dissipation cooling of the epitaxial wafer (the output of the halogen lamps was changed in several levels and the output ratio of the lamps on the upper face side to the lower face side was also changed in several levels) after growing the epitaxial layer with the manufacturing apparatus as shown in FIG. 1.

In this graph, the vertical axis represents the amount of distortion obtained by an infrared ray polarization method (or an infrared polarization method). It is clear from this graph that the temperature difference at the outer circumferential portion should be preferably within a range of plus/minus 30° C. (from minus 30° C. to plus 30° C.). More specifically, if the temperature difference was kept 30° C. or less (a range indicated by an arrow in the figure), the distortion was sufficiently low so as to prevent generation of the dislocation such that the temperature difference of 30° C. or less should be preferable. The temperature difference of 10° C. or less should be even more preferable because of the even lowered distortion.

Figure 8:
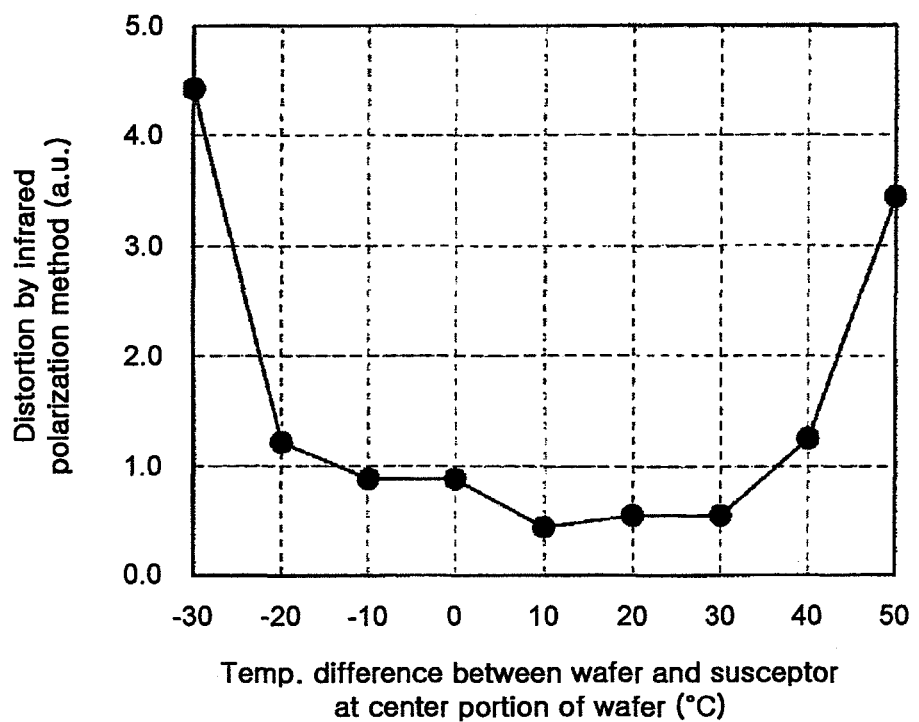
FIG. 8 is a graph showing a relation between strain and a temperature difference of a center portion of an epitaxial wafer and a portion at a corresponding position of the susceptor.

FIG. 8 is a graph that corresponds to FIG. 5 and that shows a relationship between the strain (distortion) and the temperature difference of the center portion of the epitaxial wafer and the portion at the corresponding position of the susceptor. The cooling conditions of the epitaxial wafers were the same as those of the epitaxial wafers of FIG. 5. In the center portion, the temperature difference of the center portion was preferably equal to or less than plus 40° C. and equal to or more than plus 20° C. (in other words, from plus 40° C. to minus 20° C.). The temperature difference of the center portion was more preferably equal to or less than plus 30° C. and equal to or more than minus 10° C.

Figure 6:
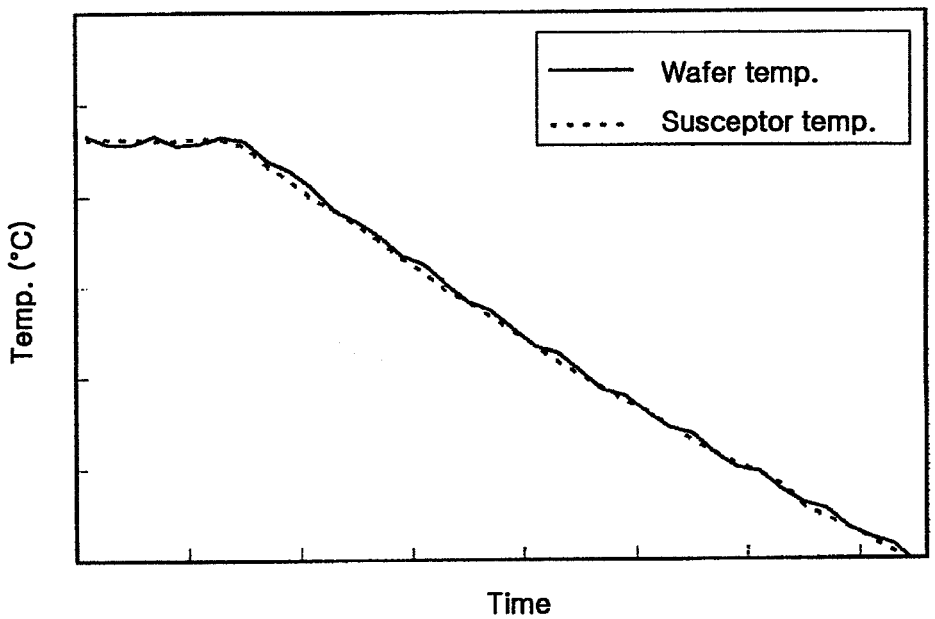
FIG. 6 is a graph showing chronological temperature changes of an outer circumferential portion of an epitaxial wafer and a portion at a corresponding position of the susceptor in the case of controlling a heater to minimize a temperature difference thereof.

FIG. 6 is a graph showing, as a function of time, the temperature of the outer circumferential portion of the epitaxial wafer and the temperature of the susceptor 14 at the corresponding position when the halogen lamps were controlled as appropriate based on the above-described experimental results such that the above-described temperature difference was kept equal to or less than 5° C. In this way, although a larger amount of heat would be added by the halogen lamps so as to lower the cooling rate slightly, it would be possible to obtain a satisfactory epitaxial wafer having a small amount of dislocation because of substantially no temperature difference.

Figure 7:
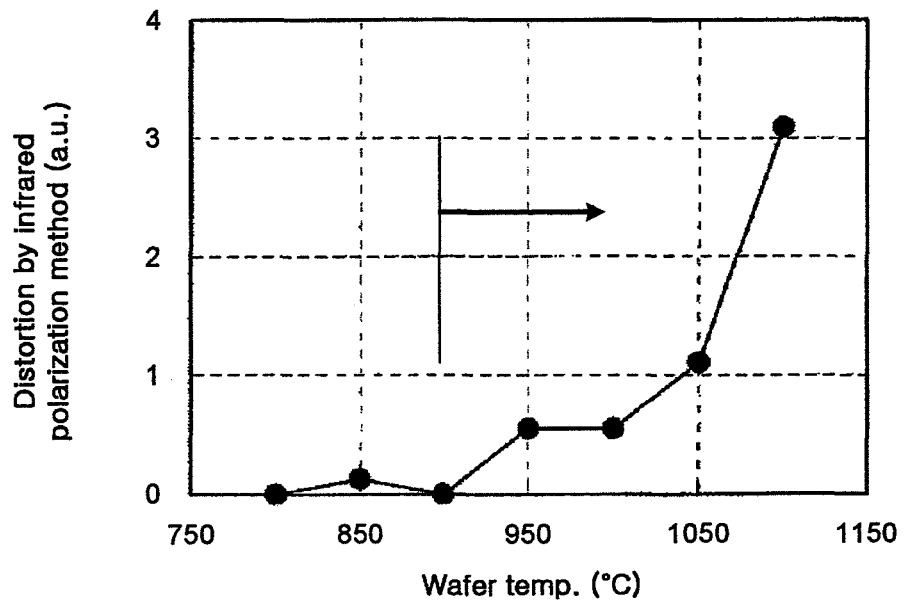
FIG. 7 is a graph showing a relation between strain and temperature of an epitaxial wafer at beginning of a cooling step in the case of managing a temperature difference of 30° C. between an outer circumferential portion of the epitaxial wafer and a portion at a corresponding position of a susceptor.

FIG. 7 is a graph showing a relationship between the strain (distortion) and the temperature at beginning of the cooling step when the temperature difference between the outer circumferential portion of the epitaxial wafer and the portion at the corresponding position of the susceptor was kept 30° C. It is clear from the graph that very little distortion was generated when the temperature at the beginning of the cooling step was equal to or less than 900° C. while the amount of distortion was increased when the temperature at the beginning of the cooling step was more than 900° C.

In particular, when the temperature was equal to or more than 1050° C., the amount of the distortion increased significantly. This is because it is more likely that the dislocation is generated at a higher temperature and it is extremely unlikely that the dislocation is generated at a low temperature even though there is some temperature difference. It is also understood that the dislocation is generated within a predetermined period of time immediately after the beginning of the cooling step as the temperature is still high. This period may vary depending on the starting temperature, but it may be at least three seconds. Otherwise, in the cooling step, it is preferable to keep the temperature difference equal to or less than 30° C. until the temperature of the epitaxial wafer becomes equal to or less than 1000° C., and it is more preferable until the temperature becomes equal to or less than 900° C.

Figure 9:
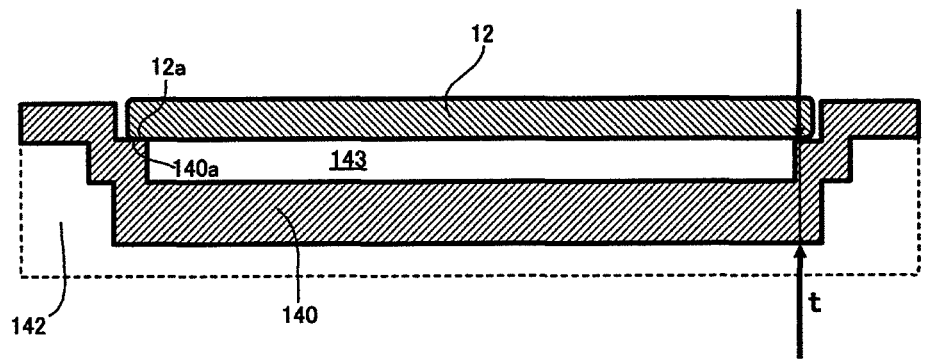
FIG. 9 is a schematic cross-sectional view of a susceptor having reduced heat capacity.

FIG. 9 is a schematic cross-sectional view of a susceptor 140 having a reduced heat capacity which can be used in the present invention. In a similar manner as the susceptor 14 is described before, the susceptor 140 has a recess portion in the middle thereof, and is provided with a step formed on the bottom surface around the inner circumferential surface of the recess portion, and a contact portion 140a of the susceptor 140 contacting the contact portion 12a of the outer circumferential portion of the silicon wafer 12 is provided on the step. A narrow space 143 is provided between the back surface of the silicon wafer 12 and the bottom surface of the susceptor 140. In this susceptor 140, an outer circumferential portion 142 is removed such that the heat capacity is reduced to become lower than a regular one. Here, by varying the thickness "t" in the figure, it is possible to vary the volume to vary the heat capacity without a considerable change in the feature of the shape. Here, the heat capacity may be determined by a formula: "specific heat (Cp)× density (ρ)×volume (V)", and more specifically, it can be preliminarily calculated with physical properties of silicon and graphite listed in table 1 below.

TABLE 1

|  | Specific heat | Density | Heat capacity per unit volume | Thermal conductivity |
|---|---|---|---|---|
| Silicon | 0.74 J/K · g | 2.33 g/cm³ | 1.72 J/K · cm³ | 160 W/m · K |
| Graphite | 0.65 J/K · g | 1.85 g/cm³ | 1.20 J/K · cm³ | 100-130 W/m · K |

Thus, the temperatures of the silicon wafer and the susceptor are supposed to increase at the same rate, if the same amount of heat per unit time is accumulated, in the case where the volume V (Si) of the wafer made of silicon is equal to about 70% of the volume V (Su) of the susceptor made of graphite since the silicon wafer and the susceptor have the same heat capacity. Here, both materials have a high thermal conductivity of 100 W/m·K or more and it can be assumed that a temperature difference within each of the members is ignored. As described above, it is preferable to appropriately perform the temperature control (the increasing and decreasing of the output of the heater, the shading, the temperature adjustment of an atmosphere (ambient) gas and the like) in consideration of whether the silicon wafer and the susceptor are equal to or different from each other in heat capacity.

Thus, when the epitaxial silicon wafer of a predetermined size (volume) is manufactured, it is possible to keep, by varying the volume and/or the material kind of the susceptor, the heat capacity of the susceptor within a range of one to three times as large as the heat capacity of the silicon wafer. For example, it is possible to manufacture the susceptor with silicon. In this case, in order to reduce reactivity, it is preferable to apply a SiC coating to the surface.

Figure 10:
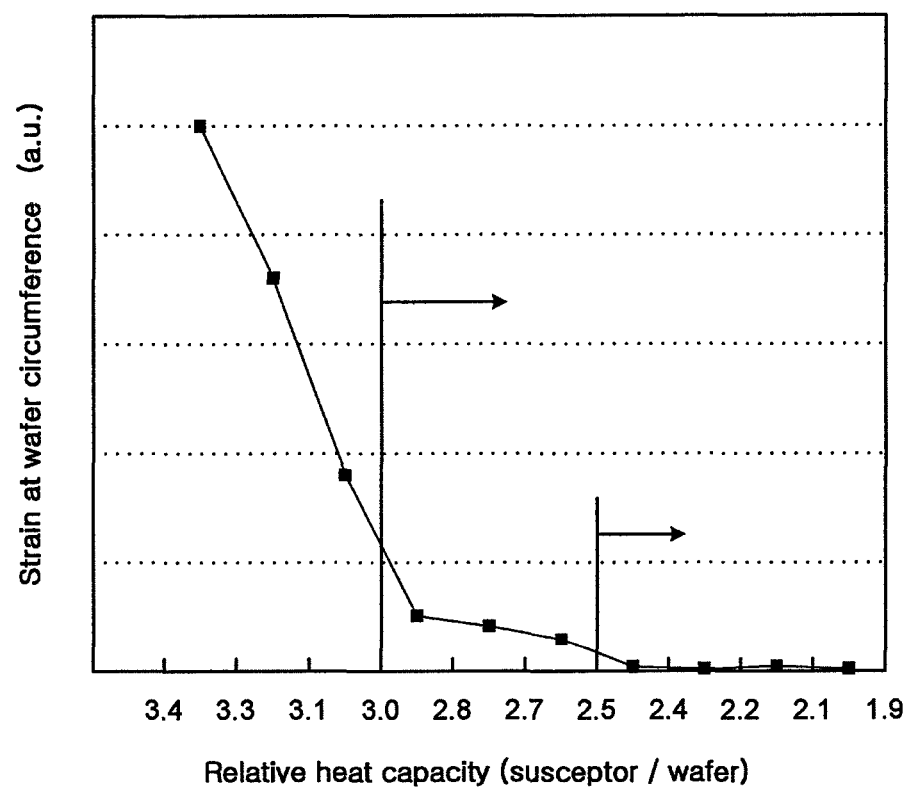
FIG. 10 is a graph showing a relation between strain at an outer circumferential portion of a silicon wafer and a heat capacity rate of a susceptor against an epitaxial wafer.

FIG. 10 is a graph showing a relationship between the amount of strain (distortion) of the outer circumferential portion of the silicon wafer and the relative heat capacity (the ratio of the heat capacity) of the susceptor to the silicon wafer when the thickness "t" as shown in FIG. 9 is varied and thus the heat capacity is varied. It is clear from the graph, when the heat capacity is three times or less, the distortion is remarkably reduced, and when it is 2.5 times or less, the distortion is further reduced.

Hence, the heat capacity ratio is preferably equal to or less than 3, and it is more preferable that the ratio is equal to or less than 2.5 and it is further preferable that the ratio is equal to or less than 2.4. In particular, the lower limit is probably unnecessary, and, since the silicon wafer is smaller in volume than the susceptor, it is realistic for the heat capacity ratio to be equal to or more than 1. As described above, realistically, the heat capacity ratio between the susceptor supporting the silicon wafer and the silicon wafer is in the range of one to three in terms of manufacturing conditions.

In this way, it is more likely that the temperatures of the silicon wafer and the susceptor vary in the same way during the heating step and the cooling step.

Figure 11:
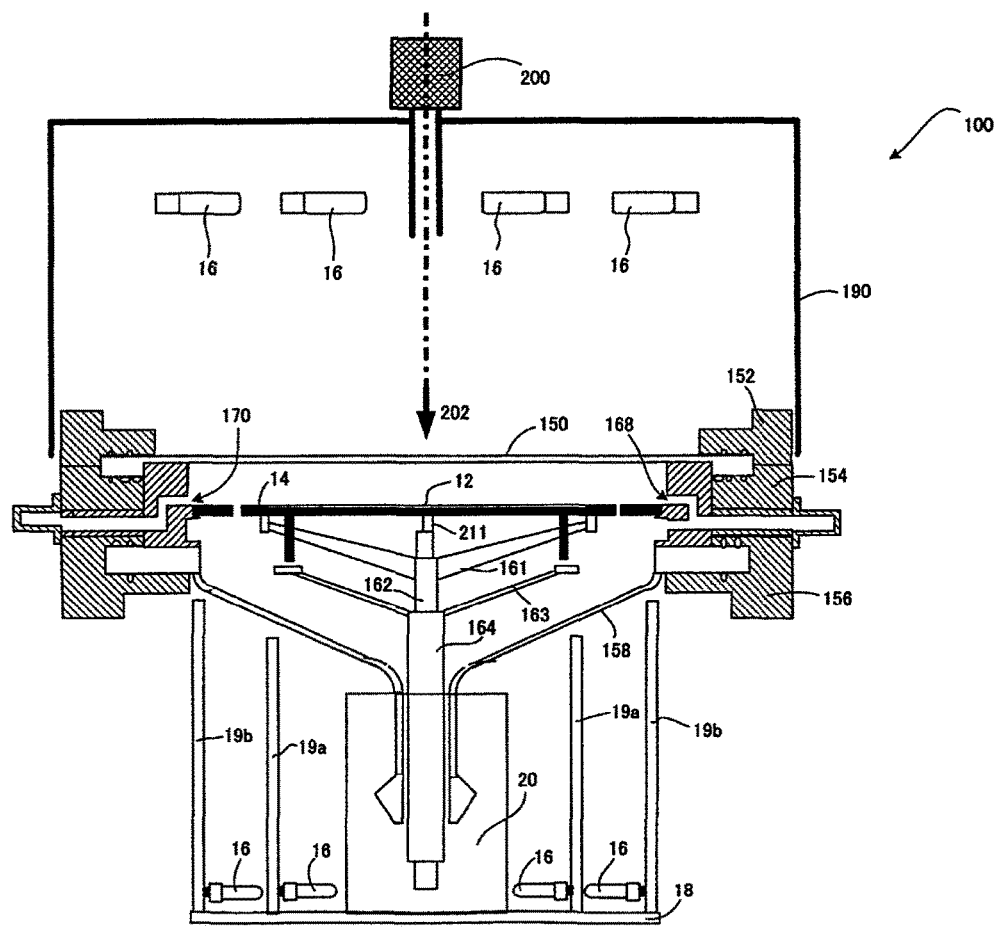
FIG. 11 is a detailed schematic diagram of an epitaxial wafer manufacturing apparatus.

FIG. 11 is a schematic diagram of an epitaxial wafer manufacturing apparatus 100. Approximately in the center of the figure, the silicon wafer 12 is arranged substantially horizontally and the susceptor 14 on which the silicon wafer 12 is placed is supported rotatably by the supporting arms 161. At least three supporting arms 161 are provided and supported in a cantilever manner by a rotational shaft 162 positioned at the center in a rotationally-symmetrical manner (the figure shows a case of four-arm supporting).

A cylindrical vertical movement supporting shaft 164 surrounding the rotational shaft 162 is provided with up-and-down supporting arms 163 as cantilevers. These members within a chamber are stored such that they can be viewed through a lower portion cover 158 and an upper window 150 made of transparent quartz glass. These cover 158 and window 150 are hermetically supported by a base frame 156 and a lid frame 152. Between the base frame 156 and a main body frame 154, there are formed an opening 168 through which the carrier gas and the raw material gas flow into the chamber and an opening 170 through which a mixed gas is discharged out of the chamber.

In a lower area, the halogen lamps 16 are arranged radially, and thus a double heating heater arranged rotationally symmetrically is configured with an inner lamp ring and an outer lamp ring. Between the inner lamp ring and the outer lamp ring, a cylindrical reflector 19a is provided so as to isolate these lamps. Outside the outer lamp ring, a similar cylindrical reflector 19b is provided so as to surround the outer lamp ring. Further inside the inner lamp ring, there is arranged a cylindrical reflector 20 that has a tapered portion at the upper portion thereof so as to cover the vertical movement supporting shaft 164. In this way, heat emitted to a shaft portion is interrupted. Below these halogen lamps 16 (at the bottom thereof), there is provided a plate-shaped reflector 18 so that the emitted heat is effectively utilized.

Above the upper window 150, likewise, the halogen lamps 16 are radially arranged in an area covered by a cover 190, resulting in the formation of double lamp rings arranged rotationally symmetrically. Heat emitted from the halogen lamps 16 is directly applied to the silicon wafer 12 through the upper window 150. Above the cover 190 and at a position directly above the center portion of the silicon wafer 12, the radiation pyrometer 200 is provided; as indicated by an arrow 202, the temperature of the center portion of the silicon wafer 12 is measured. On the other hand, in the center portion of the susceptor 14, there is provided a tube 211 above the rotational shaft 162 that incorporates an opening through which light such as emitted heat passes; the center portion of the susceptor 14 is measured with an unillustrated radiation pyrometer.

In the apparatus shown in FIG. 11, the arrangement of the individual members and their surface conditions are kept substantially constant, and thus the emission heat characteristics of the silicon wafer 12 and the susceptor 14 are substantially the same.

Hence, by starting the heat-dissipation cooling step at a relatively high temperature of about 1000° C., a relatively large amount of heat is considered to be discharged from the silicon wafer 12 and the susceptor 14 by emission; since its ratio is relatively constant, when the heat-dissipation cooling characteristics based on experiments are previously determined for each apparatus, it is possible to perform the cooling step while keeping low the temperature difference between the contact portion of the silicon wafer 12 and the supporting portion of the susceptor 14.

Then, a monitor converts, with various relational formulas or the like, temperatures determined by measuring the temperature of the center portion of the silicon wafer 12, making it possible to perform various types of temperature monitoring and heater control.

What is claimed is:

1. A method of manufacturing an epitaxial wafer in which an epitaxial layer is grown over a main surface of a silicon wafer placed substantially horizontally on a susceptor having a step supporting an outer circumferential portion on a back surface of the silicon wafer, the susceptor further having a recess at a middle portion of the susceptor at a region between the back surface of the silicon wafer and a bottom surface of the susceptor, the method comprising:

placing the silicon wafer, which is a circular plate, on a contacting portion of the susceptor being arranged on the step such that a contacting portion of the silicon wafer on the back surface contacts the contacting portion of the susceptor;

providing a narrow space between the back surface of the silicon wafer and the bottom surface of the recess such that an effect from the susceptor may be minimized;

rotating the silicon wafer with the susceptor around a center axis of the silicon wafer;

growing the epitaxial layer; and cooling the epitaxial wafer having the epitaxial layer, wherein the cooling comprises:

directly measuring a temperature of an outer circumferential portion on the main surface of the epitaxial wafer at the step supporting and contacting the contacting portion of the outer circumferential portion on the back surface of the epitaxial wafer using a first pyrometer arranged above the epitaxial wafer to point at the same outer circumferential portion, the outer circumferential portion being capable of being repeatedly measured as the silicon wafer rotates;

directly measuring a temperature of a backside of the susceptor at the step using a second pyrometer arranged below the susceptor to point at the backside of a corresponding portion of the susceptor corresponding to the outer circumferential portion of the epitaxial wafer such that the first and the second pyrometers point at each other and are aligned in a single straight vertical line such that a difference between the directly-measured temperature of the epitaxial wafer and the directly-measured temperature of the susceptor at respective outer circumferential portions corresponding to the respective contacting portions thereof is obtainable, the susceptor at the same step being capable of being repeatedly measured as the silicon wafer rotates;

directly measuring a temperature of a center portion of the epitaxial wafer using a third pyrometer arranged above the epitaxial wafer to point at the center portion;

directly measuring a temperature of the susceptor at the center portion using a fourth pyrometer arranged below the susceptor to point at a backside of a corresponding portion of the susceptor to the center portion of the epitaxial wafer so as to prevent a significant temperature difference between the center portions of the silicon wafer and the susceptor; and selectively controlling a heater comprising a heating element directly over the epitaxial wafer and another heating element arranged below the susceptor to heat either or both of the susceptor or the epitaxial wafer, by changing levels of an output of the heater and/or an output ratio of the heating elements over the epitaxial wafer and below the susceptor to supply additional heat to the epitaxial wafer during the cooling when the difference between the temperature of the epitaxial wafer and the temperature of the susceptor at the respective outer circumferential portions is beyond a range from −30° C. to +30° C., such that the difference between the temperature of the epitaxial wafer and the temperature of the susceptor at respective outer circumferential portions thereof is controlled to be lowered from the growing to the cooling and at least within a range from −30° C. to +30° C. such that a significant temperature difference of contacting portions of the silicon wafer and the susceptor is prevented.

2. The method of manufacturing the epitaxial wafer according to claim 1, wherein the epitaxial wafer is cooled from 900° C. or higher.

3. The method of manufacturing the epitaxial wafer according to claim 1, wherein output of the heater arranged above the epitaxial wafer or below the susceptor is substantially turned off.

4. The method of manufacturing the epitaxial wafer according to claim 1, wherein the susceptor comprises:

a size and a shape capable of covering a back surface of the epitaxial wafer placed on the susceptor; and heat capacity adjusted not to exceed three times as large as the heat capacity of the epitaxial wafer.

5. The method of manufacturing the epitaxial wafer according to claim 1, wherein the step of growing the epitaxial layer includes controlling a flow rate of a carrier gas and a raw material gas, the method further comprising: the step of stopping supplying the raw material gas after the step of growing.

6. The method of manufacturing the epitaxial wafer according to claim 1, further comprising:

placing the silicon wafer on the susceptor having heat capacity not exceeding three times as large as the heat capacity of the epitaxial wafer before the step of growing the epitaxial layer.

7. The method of manufacturing the epitaxial wafer according to claim 1, further comprising:

placing the silicon wafer on the susceptor having heat capacity not exceeding three times as large as the heat capacity of the epitaxial wafer by adjusting a thickness of the susceptor at an outer circumferential portion corresponding to the outer circumferential portion of the silicon wafer before the step of growing the epitaxial layer.

8. The method of manufacturing the epitaxial wafer according to claim 1, further comprising:

adjusting a thickness of the susceptor at an outer circumferential portion corresponding to the outer circumferential portion of the silicon wafer such that heat capacity of the susceptor is not exceeding three times as large as the heat capacity of the epitaxial wafer.

9. The method of manufacturing the epitaxial wafer according to claim 1, wherein a temperature in a thickness direction of the silicon wafer is uniform.

10. The method of manufacturing the epitaxial wafer according to claim 1, wherein the heater comprises a halogen lamp.

* * * * *